(12) United States Patent
Hsu et al.

(10) Patent No.: US 10,498,314 B2
(45) Date of Patent: Dec. 3, 2019

(54) VECTORED FLIP-FLOP

(71) Applicant: Intel Corporation, Santa Clara, CA (US)

(72) Inventors: Steven K. Hsu, Lake Oswego, OR (US); Amit Agarwal, Hillsboro, OR (US); Simeon Realov, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 651 days.

(21) Appl. No.: 15/178,294

(22) Filed: Jun. 9, 2016

(65) Prior Publication Data

US 2017/0359054 A1   Dec. 14, 2017

(51) Int. Cl.
*H03K 3/037* (2006.01)
*H03K 19/00* (2006.01)

(52) U.S. Cl.
CPC ....... *H03K 3/0372* (2013.01); *H03K 19/0002* (2013.01)

(58) Field of Classification Search
CPC combination set(s) only.
See application file for complete search history.

(56) References Cited

U.S. PATENT DOCUMENTS

| | | | |
|---|---|---|---|
| 6,629,276 B1 * | 9/2003 | Hoffman | G01R 31/318552 327/144 |
| 7,411,413 B2 * | 8/2008 | Shimazaki | G01R 31/318575 326/16 |
| 8,525,565 B2 * | 9/2013 | Rahman | H03K 3/356052 327/202 |
| 9,859,876 B1 * | 1/2018 | Agarwal | H03K 3/3562 |
| 9,985,612 B2 * | 5/2018 | Agarwal | H03K 3/3562 |
| 2004/0119496 A1 | 6/2004 | Park et al. | |
| 2005/0024114 A1 | 2/2005 | Banik | |
| 2007/0046340 A1 | 3/2007 | Chou et al. | |
| 2016/0111061 A1 | 4/2016 | Thenus et al. | |
| 2016/0112036 A1 | 4/2016 | Goyal et al. | |

OTHER PUBLICATIONS

International Preliminary Report on Patentability dated Dec. 20, 2018 for PCT Patent Application No. PCT/US2017/028146.
International Search Report and Written Opinion for International Patent Application No. PCT/US2017/028146, dated Aug. 18, 2017.

* cited by examiner

*Primary Examiner* — An T Luu
(74) *Attorney, Agent, or Firm* — Green, Howard & Mughal LLP

(57) ABSTRACT

An apparatus is provided which comprises: a first flip-flop (FF) cell with a data path multiplexed with a scan-data path, wherein the scan-data path is independent of a min-delay buffer, wherein the first FF cell has a memory element formed of at least two inverting cells, wherein the two inverting cells are coupled together via a common node; and a second FF cell with a data path multiplexed with a scan-data path, wherein the scan-data path of the second FF cell is independent of a min-delay buffer, and wherein the scan-data path of the second FF cell is coupled to the common node of the first FF cell.

23 Claims, 8 Drawing Sheets

VECTORED FLIP-FLOP

BACKGROUND

Area-efficient designs for modern microprocessors, DSP's (Digital Signal Processors), SoC's (System-on-Chip) in wearables, IoTs (Internet-of-Things), smartphones, tablets, laptops, and servers, etc., are increasingly becoming a critical factor due to the following requirements: reducing silicon cost, decreasing PCB (Printed Circuit Board) footprint, improving time-to-market (TTM), and slower scaling cadence of process technology node. These requirements all need to be met while meeting the stringent frequency and/or performance targets and power/leakage budgets. One important standard cell and fundamental building block of any digital integrated circuit is the flip-flop (FF), which is required to store state in any sequential logic. Flip-flops may account for a large percentage of an integrated circuit (IC) area (e.g., greater than 30%). Flip-flops may account for a large percentage of power consumption in a clock tree and final sequential load (e.g., greater than 30%).

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
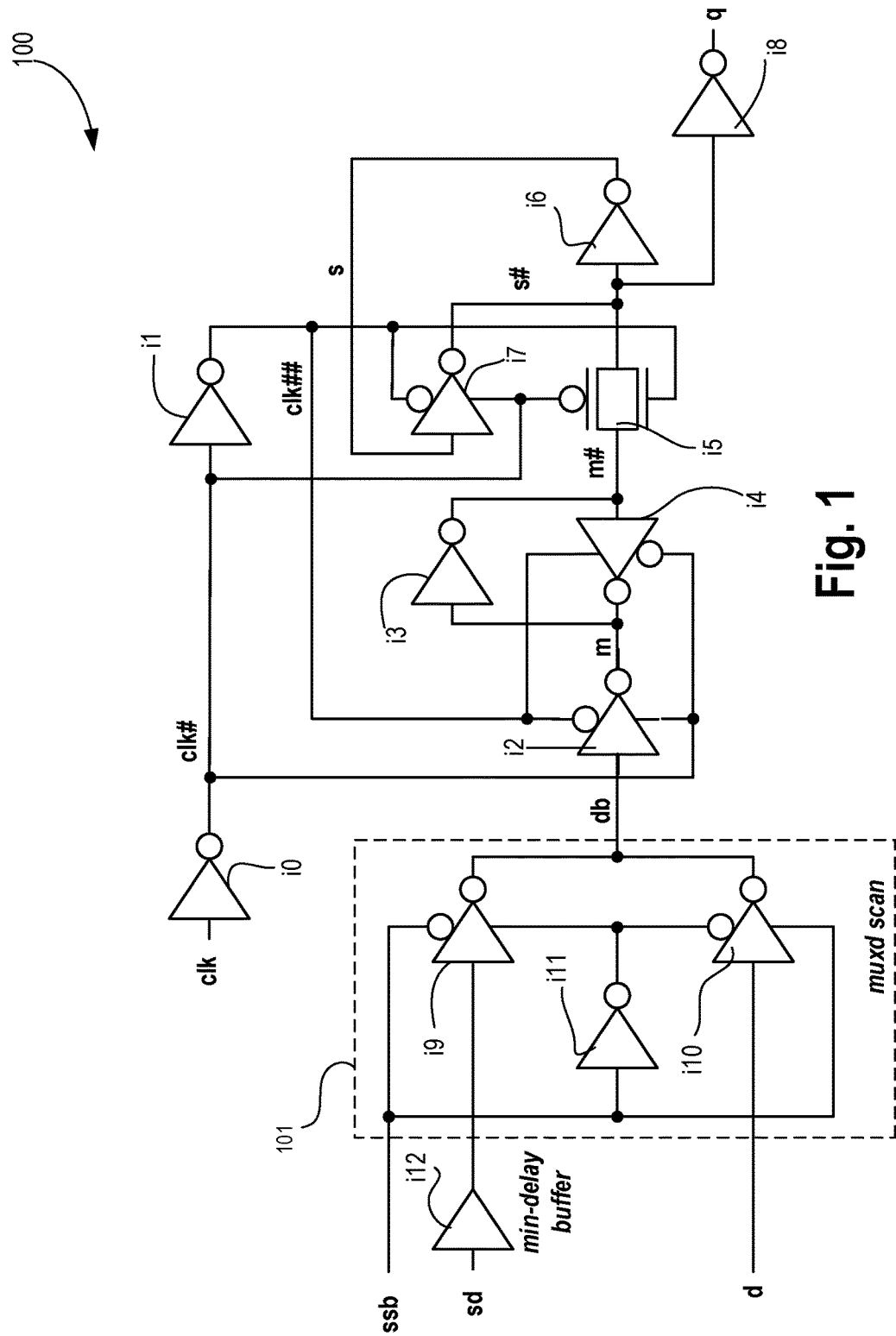
FIG. 1 illustrates a flip-flop (FF) with a scan cell and scan min-delay buffer.

One of the limiters of $V_{MIN}$ is the sequential hold time degradation, or min-delay paths, at lower voltages resulting in frequency independent functional failures. Here, the term "$V_{MIN}$" or "minimum operating voltage" generally refers to the lowest operating voltage level below which the sequential (e.g., flip-flop) will lose its data. These hold time failures are exacerbated at low supply voltages (e.g., less than 1V), but also can occur at nominal to high voltages (e.g., 1.1V-1.5V), so it is important that the sequential design is tolerant to them. These min-delay paths are commonly found in a scan path. A person skilled in the art would appreciate that sequential such as scan enabled flip-flops may have two data paths—one for regular data and another for scan data. The scan data path can be used for debugging purposes, for example.

The data path that begins with the scan data input is referred to as the scan path. To avoid hold timing violation in the scan path, min-delay buffers are added to the scan data path. A timing path through the min-delay buffers is referred to as a min-delay path. These min-delay path failures (e.g., hold timing violation through the min-delay path) can be caused by systematic and random variations in local clock inverters of the sequential. Min-delay buffers increase area and power of the sequential (e.g., flip-flop) but are necessary for functional reasons.

Some embodiments describe a vectored flip-flop circuit which takes advantage of shared clock inverters to remove the unnecessary min-delay buffers, extra scan transistors, and push scan routing internal to flip-flop cell (of the vectored flip-flop) to reduce flip-flop cell area and to reduce block level routing congestion. In some embodiments, since the local clock inverters are shared between all vectored flip-flops, this allows the min-delay buffers to be removed since any systematic or random variation effect all internal clock signals equally and may not cause a race.

The flip-flop circuitry of some embodiments enables internal scan connections in lower level metals (e.g., Metal layer 1 (M1)) freeing up critical block level metals (e.g., Metal layer 2 (M2) and higher) that conventional designs typically use to route. Reduction of upper metal layers (e.g., M2 and higher) in the flip-flop circuitry of some embodiments reduces wire congestion and eliminates pin inputs on the FF cell reducing the block level connection complexity. In some embodiments, internally "look-aside" scan routing is provided which reduces the output load by one gate since the scan connection is not tapped from the output. Various embodiments result in lower standard cell area (e.g., 17% lower standard FF cell area) with comparable timing and power vs. a conventional vectored flip-flop. In some embodiments, an internally stitched scan flip-flop is provided that eliminates extra redundant scan transistors. One such embodiment further reduces area (e.g., by 27% compared to the area of a conventional vectored FF).

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1 illustrates FF 100 with a scan cell and scan min-delay buffer. FF 100 consists of a five peripheral pins—input pin clock ("clk"), input pin data ('d'), input pin scan-data ("sd"), input pin scan enable ("ssb"), and output pin clocked data ('q'). FF 100 includes a scan data multiplexer 101, minimum delay (min-delay) buffer "i12", clock buffer including inverters "i0" and "i1", and a transmission-gate (TG) based master-slave FF cell.

Scan data multiplexer 101 comprises tristate inverter "i10" which is coupled to 'd', tristate inverter "i9" which is coupled to min-delay buffer "i12", and inverter "i11" which is coupled to tristate inverters "i9" and "i10". The tristate buffers "i9" and "i10" are coupled to "ssb" and an output of inverter "i11". The min-delay buffer "i12" is coupled to "sd" and provides input to the tristate inverter "i9". The min-delay buffer "i12" is composed of usually at least 6 devices.

The output "db" of scan data multiplexer 101 is one of data or scan-data "sd" depending on the logical level of "ssb". Here, labels for signals, pins, and nodes are interchangeably used. For example, 'd' may refer to input pin data, data, or data node depending on the context of the sentence.

Clock buffer receives input clock "clk" by inverter "i0", and generates an inverted version of that clock "clk#". The inverted version of clock "clk#" is further inverted by inverter "i1" to generate "clk##". Clocks "clk#" and "clk##" are used for slave and master cells of the FF cell. The FF cell includes tristate inverters "i2", "i4", and "i7"; inverters "i3", "i6", and "i8"; transmission gate "i5"; and nodes "db", "m#", 's', "s#", "clk#" and "clk##" coupled together as shown. Here, master cell of FF cell includes tristate inverters "i2" and "i4", and inverter "i3"; and slave cell of FF cell includes tristate inverter "i7" and inverter "i5". The master cell and the slave cell are coupled together via transmission gate "i5". The memory element of the master cell includes cross-coupled inverter "i3" and tristate inverter "i4". The memory element of the slave cell includes cross-coupled inverter i6 and tristate inverter "i7". The output 'q' of the FF cell is provided by inverter "i8".

Figure 2:
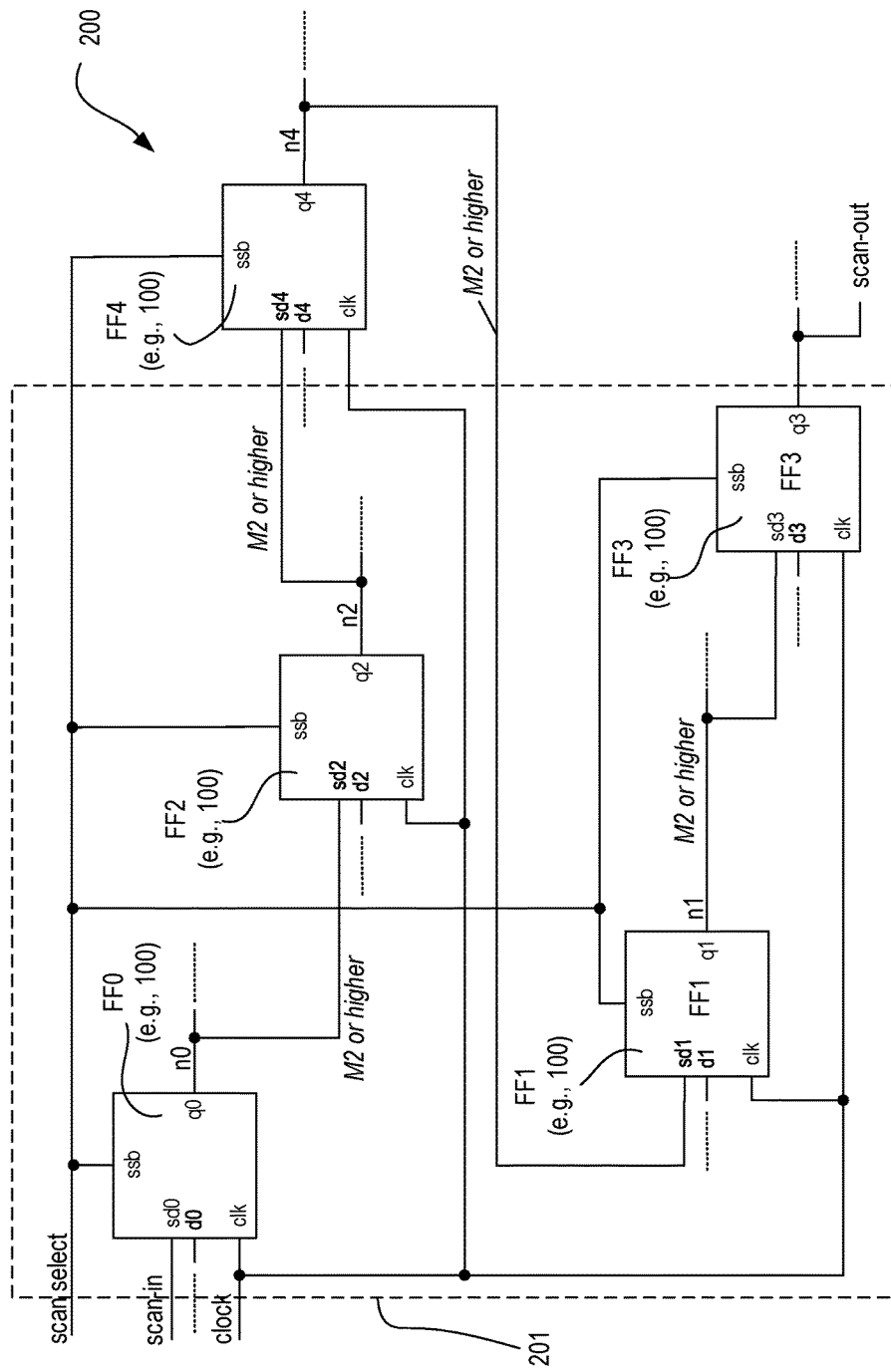
FIG. 2 illustrates a scan-chain using the FF of FIG. 1.

FIG. 2 illustrates scan-chain 200 using FF 100 of FIG. 1. It is pointed out that those elements of FIG. 2 having the same reference numbers (or names) as the elements of any other figure can operate or function in any manner similar to that described, but are not limited to such. Scan-chain 200 includes a vectored quad-FF 201 coupled to FF4 (e.g., FF 100). The inputs of scan-chain 200 are "scan_select", "scan_in", node "n4", and "clock". The output of scan-chain 200 is "scan-out". Input "scan_select" is received by input pin "ssb" of FF, input "scan_in" is received by scan data input of the first FF FF0 (i.e., "sd0" pin which is same as "sd" of FIG. 1), and "clock" is received by "clk" of all FFs. Here, scan-chain 200 is connected using single flip-flops (FF0, FF1, FF2, FF3, and FF4) as shown using M2 layer or higher interconnects "n0", "n2", "n4", and "n1". It is common to physically cluster or vector single FFs together and share the same clock signals locally for clock power reduction.

Figure 3:
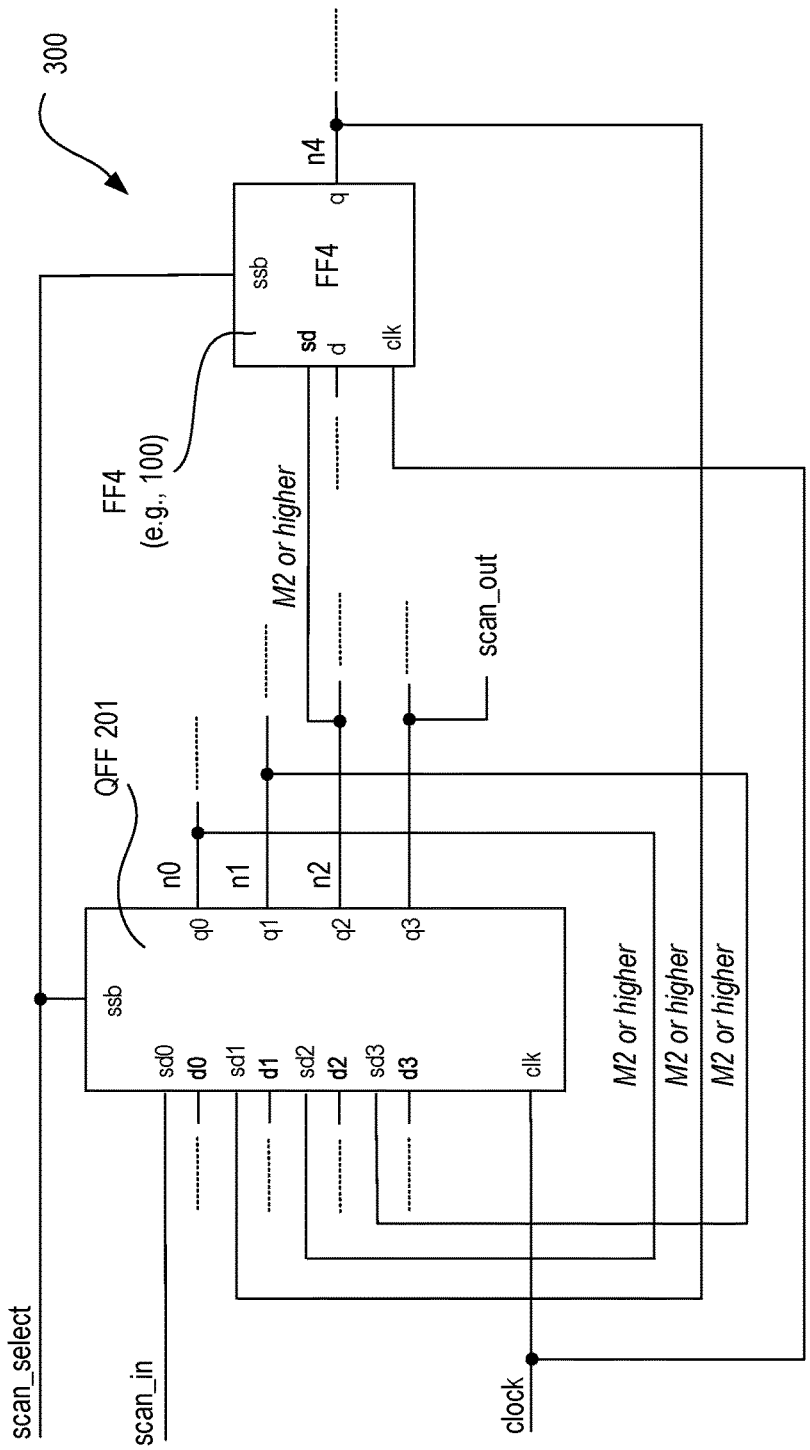
FIG. 3 illustrates a scan-chain connection with quad vector FF and one transmission gate FF.

FIG. 3 illustrates apparatus 300 of scan-chain connection with quad vector FF (QFF) 201 and one transmission gate FF FF4. It is pointed out that those elements of FIG. 3 having the same reference numbers (or names) as the elements of any other figure can operate or function in any manner similar to that described, but are not limited to such. Apparatus 300 shows an example of how scan data is routed in a design with vectored flip-flops. Here, QFF 201 may be a standard cell (e.g., part of a standard cell library). The scan signals "sd0", "sd1", "sd2", and "sd3" are routed internally or externally to standard cell QFF 201 by using block level metal resources (e.g., M2 or higher).

Figure 4:
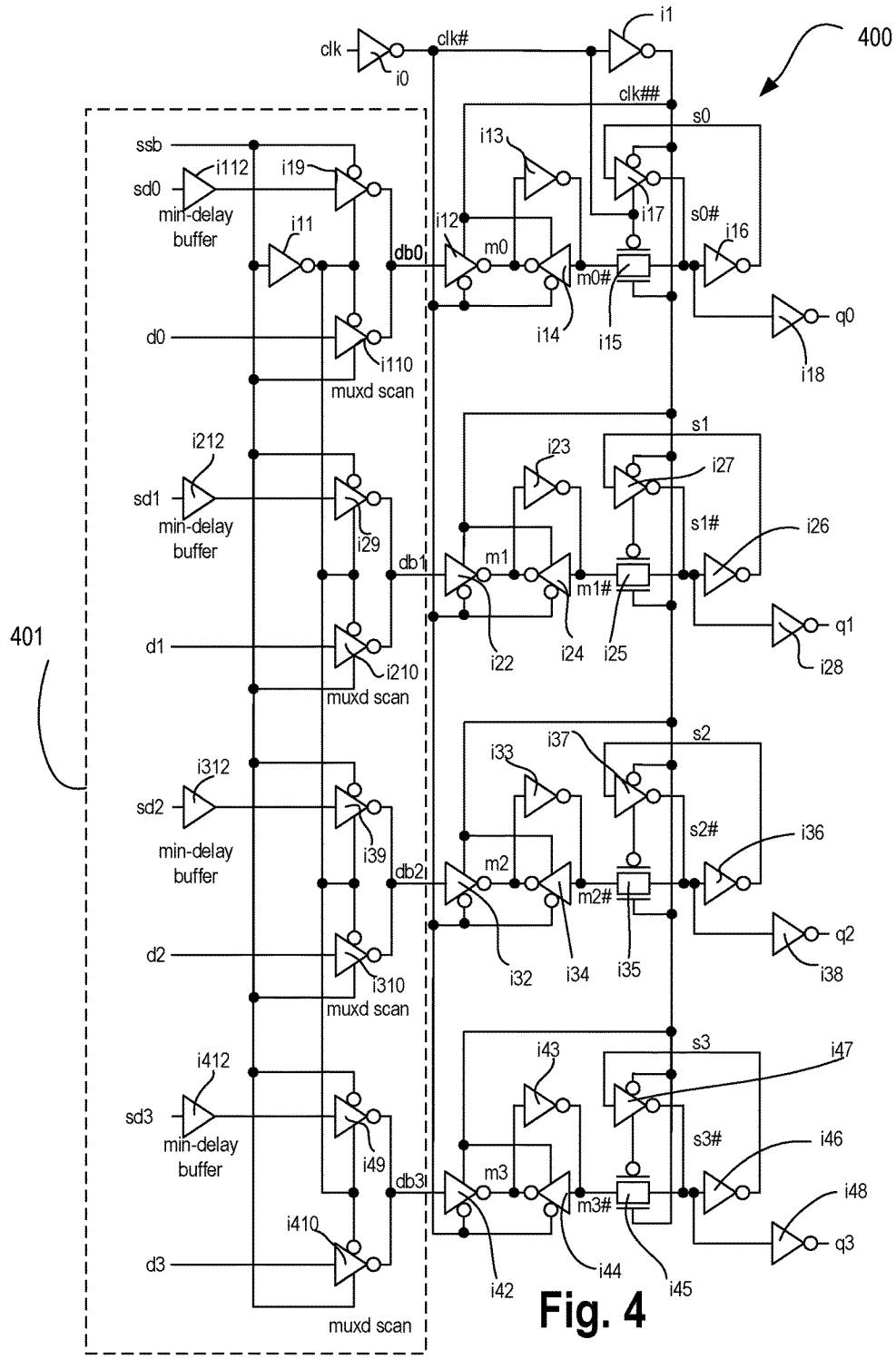
FIG. 4 illustrates details of the quad vector FF of FIG. 3.

FIG. 4 illustrates details of quad vector FF 400 (e.g., 201 of FIG. 3). It is pointed out that those elements of FIG. 4 having the same reference numbers (or names) as the elements of any other figure can operate or function in any manner similar to that described, but are not limited to such. In this example, a vectored flip-flop of 4 FF cells with min-delay buffers is shown. Since a synthesis tool has the capability to connect any flip-flop scan output to any scan input, the need for min-delay buffers to address clock skew and hold time is needed for quad vector flip-flop 201.

Quad vector flip-flop 400 has a four input scan data multiplexer 401. The four scan inputs are "sd0", "sd1", "sd2", and "sd3", each of which is delayed by a min-delay buffer. The four data inputs of scan data multiplexer 401 are "d0", "d1", "d2", and "d3". The four outputs of quad vector flip-flop 400 are "q0", "q1", "q2", and "q3".

For example, min-delay buffer "i112" is coupled to "sd0", min-delay buffer "i212" is coupled to "sd1", min-delay buffer "i312" is coupled to "sd2", and min-delay buffer "i412" is coupled to "sd3". Here, each FF cell and is associated scan data multiplexer is same as the FF cell and scan data multiplexer 101 of FIG. 1.

For example, min-delay buffers "i112", "i212", "i312", and "i412" behave the same as min-delay buffer "i12" of FF 100; scan data multiplexer tristate inverters "i19", "i29", "i39", and "i40" behave the same as tristate inverter "i9" of FIG. 1; scan data multiplexer tristate inverters "i110", "i210", "i310", and "i410" behave the same as tristate inverter "i10" of FIG. 1; tristate inverters "i12", "i22", "i32", and "i42" behave the same as "i2" of FIG. 1; tristate inverters "i14", "i24", "i35", and "i45" behave the same as "i4" of FIG. 1; inverters "i13", "i23", "i33", and "i43" behave the same as "i3" of FIG. 1; tristate inverters "i17", "i27", "i36", and "i46" behave the same as tristate inverter "i7" of FIG. 1; inverters "i16", "i26", "i36", and "i46" behave the same as inverter "i6" of FIG. 1; transmission gates "i15", "i25", "i35", and "i45" behave the same as transmission gate "i5" of FIG. 1; and inverters "i18", "i28", "i38", and "i48" behave the same as inverter "i8" of FIG. 1.

The internal nodes of each FF cell of Quad vector flip-flop 400 also behaves the same as the internal nodes of FF 100 of FIG. 1. For example, nodes "db0", "db1", "db2", and "db3" are formed of the same metal layer as node "db" of FF 100 and also behave the same way; nodes "m0", "m1", "m2", and "m3" are formed of the same metal layer as node 'm' of FF 100 and also behave the same way; nodes "m0#", "m1#", "m2#", and "m3#" are formed of the same metal layer as node "m#" of FF 100 and also behave the same way; nodes "s0", "s1", "s2", and "s3" are formed of the same metal layer as node 's' of FF 100 and also behave the same way; nodes "s0#", "s1#", "s2#", and "s3#" are formed of the same metal layer as node s# of FF 100 and also behave the same way.

Figure 5:
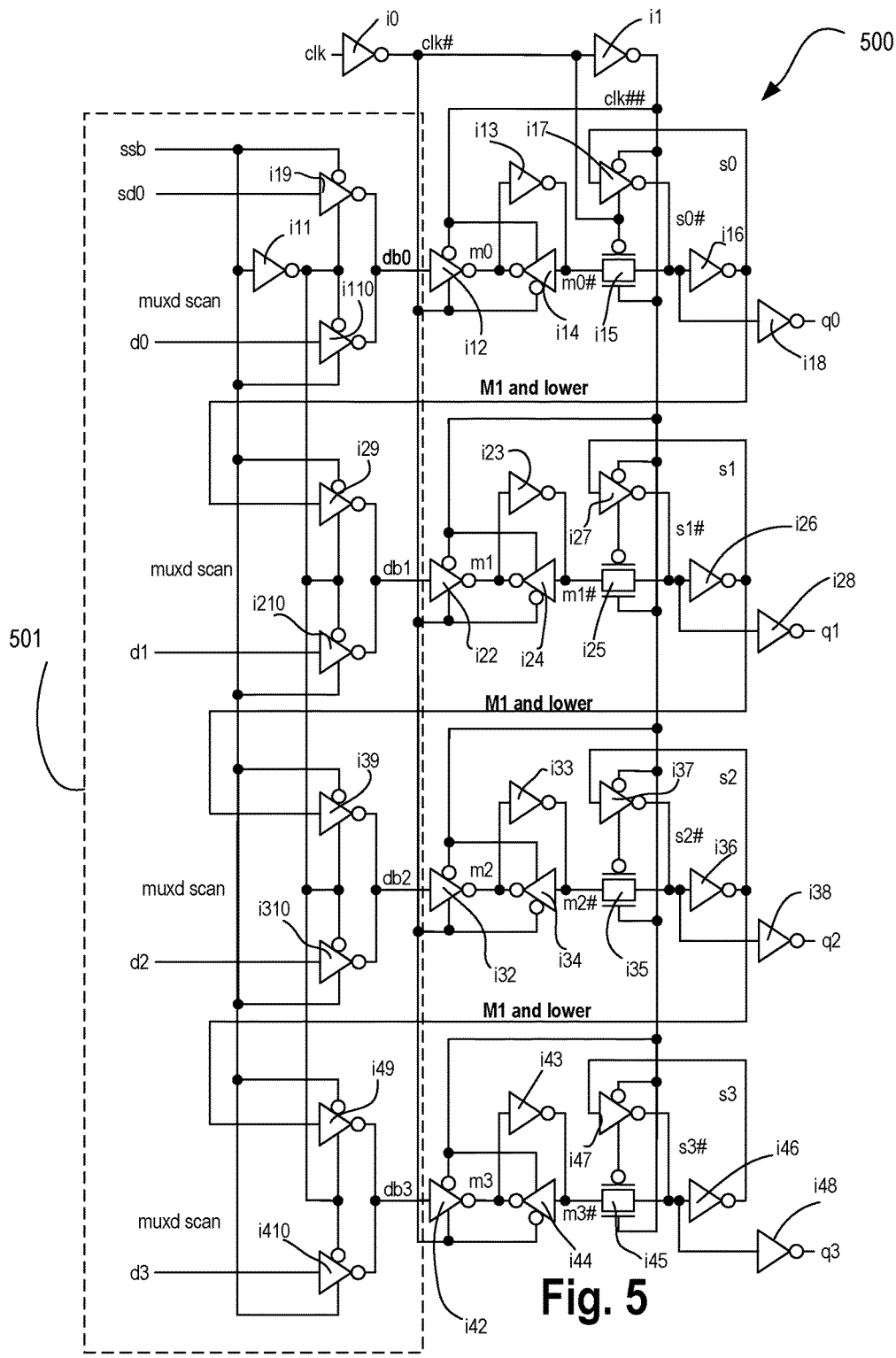
FIG. 5 illustrates a quad vector FF with look-aside internal scan-chain, according to some embodiments of the disclosure.

FIG. 5 illustrates quad vector FF 500 with look-aside internal scan-chain, according to some embodiments of the disclosure. It is pointed out that those elements of FIG. 5 having the same reference numbers (or names) as the elements of any other figure can operate or function in any manner similar to that described, but are not limited to such.

In some embodiments, quad vector FF 500 takes advantage of the physical locality and shared clock inverters "i0" and "i1" of the flop-flops to remove some or all min-delay buffers (e.g., buffers "i112", "i212", "i312", and "i412") and also push scan routing internal to the cell to reduce flip-flop cell area. For example, node "s0" of the first FF cell is directly coupled to tristate inverter "i29" of the second FF cell, node "s1" of the second FF cell is directly coupled to the tristate inverter "i39" of the third FF cell, and node "s2" of the third FF cell is directly coupled to the tristate inverter "i49" of the fourth FF cell. In some embodiments, clocks "clk#" and "clk##" are shared by all the FF cells.

This topology of quad vector FF 500 uses more efficient local metal routing for scan connections wiring congestion and reduces the output fan-out by 1 gate compared to quad vector flip-flop 400. Circuit and layout optimizations are provided by quad vector flip-flop 500. For example, a 17% reduction in cell area is achieved by reducing fan-out by 1 gate load on the output. Further, block level M2 wiring congestion is improved by quad vector flip-flop 500 since all scan connections (e.g., nodes "s0", "s1", "s2", and "s3") are in lower level metals (e.g., M1 and below) inside the standard cell vs. a conventional vector flip-flop 400 of FIG. 4.

Figure 6:
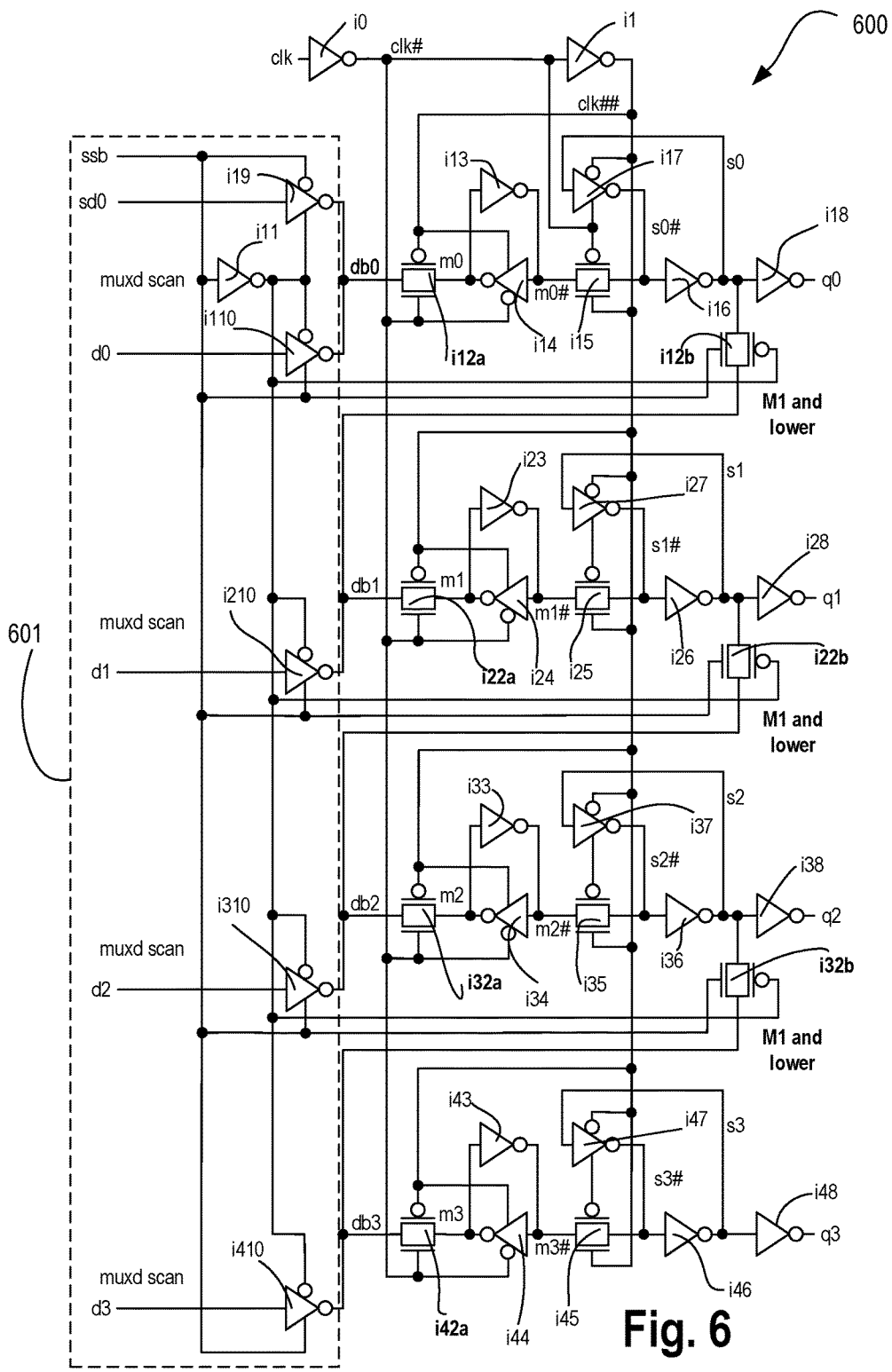
FIG. 6 illustrates a high-density quad vector FF with internal scan-chain, according to some embodiments of the disclosure.

FIG. 6 illustrates a high-density quad vector flip-flop 600 with internal scan-chain, according to some embodiments of the disclosure. It is pointed out that those elements of FIG. 6 having the same reference numbers (or names) as the elements of any other figure can operate or function in any manner similar to that described, but are not limited to such.

In some embodiments, the scan multiplexer transistors are mostly removed and functionally implemented by transmission gates "i12b", "i22b", and "i32b". In some embodiments, tristate inverters "i12", "i22", "i32", and "i42" are replaced by transmission gates "i12a", "i22a", "i32a", and "i42a". In some embodiments, one end of transmission gate i12b is coupled to node "s0" and another end of transmission gate "i12b" is coupled to node "db1." In some embodiments, one end of transmission gate "i22b" is coupled to node "s1" and another end of transmission gate "i22b" is coupled to node "db2." In some embodiments, one end of transmission gate "i32b" is coupled to node "s2" and another end of transmission gate "i32b" is coupled to node "db3." High-density quad vector flip-flop 600 may be smaller in area than quad vector flip-flop 500 because tristate inverters "i12", "i22", "i32", and "i42" are replaced by transmission gates "i12a", "i22a", "i32a", and "i42a"; and six scan multiplexer transistors are removed.

Figure 7:
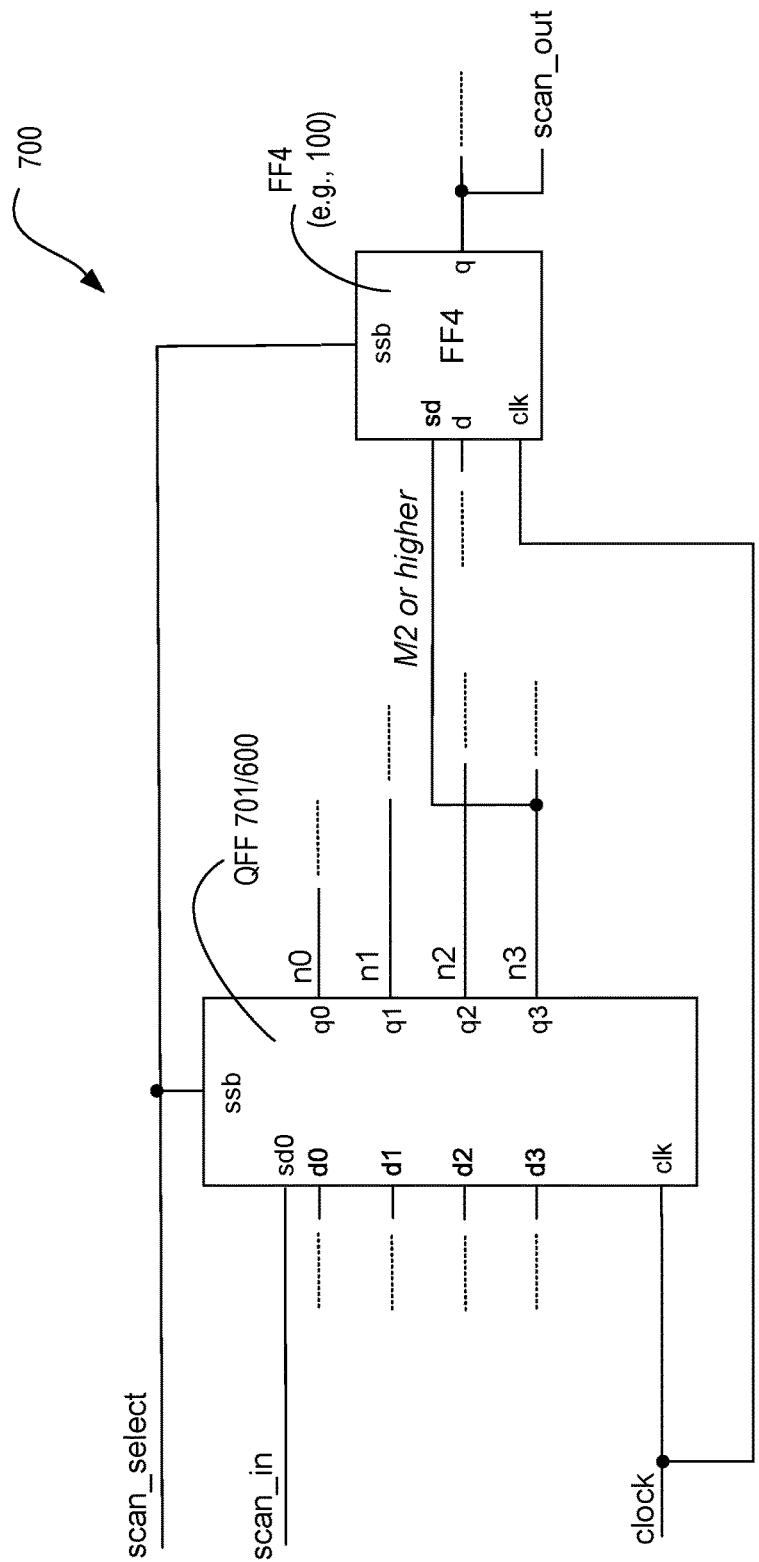
FIG. 7 illustrates a scan-chain connection with a quad vector FF of FIG. 5/6, according to some embodiments of the disclosure.

FIG. 7 illustrates apparatus 700 scan-chain connection with quad vector flip-flop 601 (e.g., 500/600 of FIG. 5/6), according to some embodiments of the disclosure. It is pointed out that those elements of FIG. 7 having the same reference numbers (or names) as the elements of any other figure can operate or function in any manner similar to that described, but are not limited to such. Compared to QFF 201 of FIG. 3, routing congestion is reduced in apparatus 700. In this example, four FFs of quad vector flip-flop 701 are chained sequentially with internal routing.

Table 1 shows the worst-case timing, power (e.g., data activity of 30%) based off extracted parasitic capacitances, and area comparisons for vectored quad FFs of FIGS. 4-6, showing both timing and power are comparable.

TABLE 1

| Quad Flip-flop Type | Setup | Clk2Q | Setup + Clk2Q | Hold | Power | Area |
|---|---|---|---|---|---|---|
| FIG. 4 | 1.0 | 1.0 | 1.0 | 1.0 | 1.0 | 1.0 |
| FIG. 5 "Look-aside" internally stitched | 0.95 | 1.06 | 1.01 | 0.92 | 1.04 | 0.82 |
| FIG. 6 High Density internally stitched | 0.86 | 1.17 | 1.04 | 0.40 | 1.03 | 0.73 |

Table 1 illustrates that removal of min-delay buffer and extra scan transistors in FIG. 5 and FIG. 6 result in 17% and 27%, respectively, area reduction without compromising delay, power, or functionality. The embodiments of FIGS. 5-7 allows for improvement in local scan routing and number of input-output (I/O) pins by pushing metal layer (M2) routing internal to the standard cell in lower level metals. As such, area and wiring congestion improves over apparatus 300, and metal resources are freed up for block level routing. The embodiments of FIGS. 5-7 also improve flip-flop drive strength by reducing the fan-out by one gate load since the scan is routed internally with a "look-aside"

path. Here the term "look-aside" is used to illustrate that feedback nodes "s0" through "s2" are used instead of nodes "q0" through "q2" for scan stitching.

While the various embodiments are illustrated for quad vectored scan FFs, the embodiments are not limited to such. For example, the area and routing reduction techniques discussed with reference to various embodiments can be used for vectored reset FFs, vectored preset FFs, etc., that can be clustered together into one cell. For instance, in addition to quad vectors, the embodiments are also applicable to FF vectors of 2, 3, 6, etc.

Figure 8:
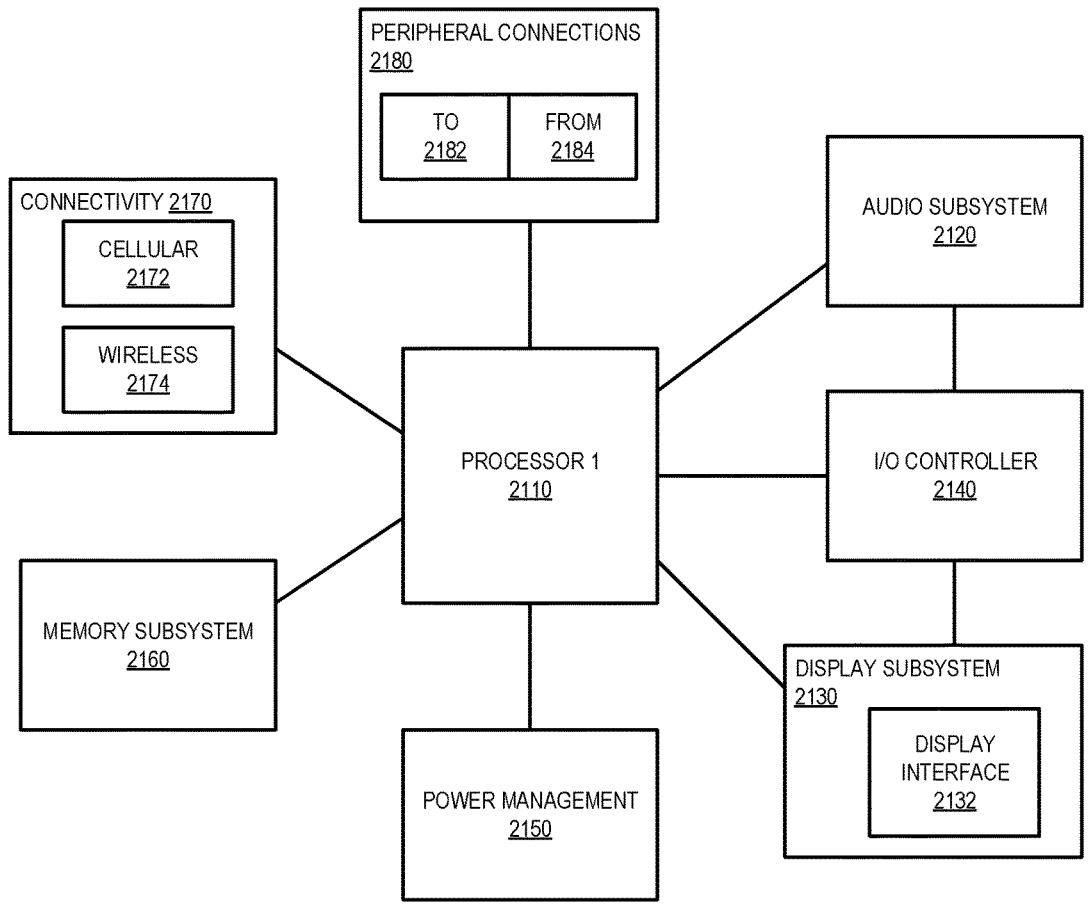
FIG. 8 illustrates a smart device or a computer system or a SoC (System-on-Chip) with a scan-chain having a quad vector FF of FIG. 5/6/7, in accordance with some embodiments.

FIG. 8 illustrates a smart device or a computer system or a SoC (System-on-Chip) 2100 with scan-chain having quad vector flip-flop of FIG. 5/6/7, in accordance with some embodiments. It is pointed out that those elements of FIG. 8 having the same reference numbers (or names) as the elements of any other figure can operate or function in any manner similar to that described, but are not limited to such.

FIG. 8 illustrates a block diagram of an embodiment of a mobile device in which flat surface interface connectors could be used. In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in computing device 2100.

In some embodiments, computing device 2100 includes a first processor 2110 with scan-chain having quad vector flip-flop of FIG. 5/6/7, according to some embodiments discussed. Other blocks of the computing device 2100 may also include a scan-chain having quad vector flip-flop of FIG. 5/6/7 according to some embodiments. The various embodiments of the present disclosure may also comprise a network interface within 2170 such as a wireless interface so that a system embodiment may be incorporated into a wireless device, for example, cell phone or personal digital assistant.

In one embodiment, processor 2110 (and/or processor 2190) can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display M.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a first flip-flop (FF) cell with a data path multiplexed with a scan-data path, wherein the first FF cell has a memory element formed of at least two inverting cells, wherein the two inverting cells are coupled together via a common node; and a second FF cell with a data path multiplexed with a scan-data path, and wherein the scan-data path of the second FF cell is coupled to the common node of the first FF cell. In some embodiments, the second FF cell includes a memory element formed of at least two inverting cells, and wherein the two inverting cells are coupled together via a common node of the second FF cell.

In some embodiments, the apparatus comprises a third FF cell with a data path multiplexed with a scan-data path, wherein the scan-data path of the third FF cell is independent of a min-delay buffer, and wherein the scan-data path of the third FF cell is coupled to the common node of the second FF cell. In some embodiments, the third FF cell includes a memory element formed of at least two inverting cells, and wherein the two inverting cells are coupled together via a common node of the third FF cell. In some embodiments, the apparatus comprises a fourth FF cell with a data path multiplexed with a scan-data path, wherein the scan-data path of the third FF cell is independent of a min-delay buffer, and wherein the scan-data path of the fourth FF cell is coupled to the common node of the third FF cell.

In some embodiments, the apparatus comprises a clock buffer to provide a clock and a complementary version of the clock to the first, second, third, and fourth FF cells. In some embodiments, the first, second, third, and fourth FF cells together form a vectored quad-FF, and wherein an output of the fourth FF cell is coupled to a scan input of another FF cell. In some embodiments, the scan-data paths of the first, second, third, and fourth FF cells are independent of a min-delay buffer.

In some embodiments, the first FF cell includes a master cell having a first memory element, and a slave cell having a second memory element, and wherein the memory element of the first FF is the second memory element. In some embodiments, the second memory element is coupled to the first memory element via a pass-gate. In some embodiments, the apparatus comprises an output driver coupled to the pass-gate and the second memory element.

In another example, a system is provided which comprises: a memory; a processor coupled to the memory, the processor including a vectored quad-flip-flop (FF), the quad-FF having an apparatus according to the apparatus described above; and a wireless interface for allowing the processor to communicate with another device.

In another example, an apparatus is provided which comprises: a first flip-flop (FF) cell with a data path multiplexed with a scan-data path; wherein the first FF cell has a memory element formed of at least two inverting cells, and wherein the two inverting cells are coupled together via a common node; a first pass-gate coupled to the common node; and a second FF cell with a data path multiplexed with a scan-data path via the first pass-gate. In some embodiments, the second FF cell includes a memory element formed of at least two inverting cells, and wherein the two inverting cells are coupled together via a common node of the second FF cell. In some embodiments, the apparatus comprises: a second pass-gate coupled to the common node of the second FF cell; and a third FF cell with a data path multiplexed with a scan-data path via the second pass-gate.

In some embodiments, the apparatus comprises: a third pass-gate coupled to the common node of the third FF cell; and a fourth FF cell with a data path multiplexed with a scan-data path via the third pass-gate. In some embodiments, the apparatus comprises a clock buffer to provide a clock and a complementary version of the clock to the first, second, third, and fourth FF cells. In some embodiments, the first, second, third, and fourth FF cells together form a vectored quad-FF, and wherein an output of the fourth FF cell is coupled to a scan input of another FF cell. In some embodiments, the scan-data paths of the first, second, third, and fourth FF cells are independent of a min-delay buffer.

In another example, a system is provided which comprises: a memory; a processor coupled to the memory, the processor including a vectored quad-flip-flop (FF), the quad-FF having an apparatus according to the apparatus described above; and a wireless interface for allowing the processor to communicate with another device.

In another example, an apparatus is provided which comprises: a quad-flip-flop (FF) having four FF cells which are operable to couple sequentially via a scan-mux forming a scan data path, wherein the scan data path is independent of min-delay buffers.

In some embodiments, the quad-FF comprises: a first flip-flop (FF) cell with a data path multiplexed with a scan-data path, wherein the first FF cell has a memory element formed of at least two inverting cells, wherein the two inverting cells are coupled together via a common node; and a second FF cell with a data path multiplexed with a scan-data path, and wherein the scan-data path of the second FF cell is coupled to the common node of the first FF cell. In some embodiments, the second FF cell includes a memory element formed of at least two inverting cells, and wherein the two inverting cells are coupled together via a common node of the second FF cell.

In some embodiments, the apparatus comprises a third FF cell with a data path multiplexed with a scan-data path, wherein the scan-data path of the third FF cell is independent of a min-delay buffer, and wherein the scan-data path of the third FF cell is coupled to the common node of the second FF cell. In some embodiments, the third FF cell includes a memory element formed of at least two inverting cells, and wherein the two inverting cells are coupled together via a common node of the third FF cell. In some embodiments, the apparatus comprises a fourth FF cell with a data path multiplexed with a scan-data path, wherein the scan-data path of the third FF cell is independent of a min-delay buffer, and wherein the scan-data path of the fourth FF cell is coupled to the common node of the third FF cell.

In some embodiments, the apparatus comprises a clock buffer to provide a clock and a complementary version of the clock to the first, second, third, and fourth FF cells. In some embodiments, the first, second, third, and fourth FF cells together form a vectored quad-FF, and wherein an output of the fourth FF cell is coupled to a scan input of another FF cell. In some embodiments, the scan-data paths of the first, second, third, and fourth FF cells are independent of a min-delay buffer.

In some embodiments, the first FF cell includes a master cell having a first memory element, and a slave cell having a second memory element, and wherein the memory element of the first FF is the second memory element. In some embodiments, the second memory element is coupled to the first memory element via a pass-gate. In some embodiments, the apparatus comprises an output driver coupled to the pass-gate and the second memory element.

In some embodiments, the quad-FF includes an apparatus which comprises: a first flip-flop (FF) cell with a data path multiplexed with a scan-data path; wherein the first FF cell has a memory element formed of at least two inverting cells, and wherein the two inverting cells are coupled together via a common node; a first pass-gate coupled to the common node; and a second FF cell with a data path multiplexed with a scan-data path via the first pass-gate. In some embodiments, the second FF cell includes a memory element formed of at least two inverting cells, and wherein the two inverting cells are coupled together via a common node of the second FF cell. In some embodiments, the apparatus comprises: a second pass-gate coupled to the common node of the second FF cell; and a third FF cell with a data path multiplexed with a scan-data path via the second pass-gate.

In some embodiments, the apparatus comprises: a third pass-gate coupled to the common node of the third FF cell; and a fourth FF cell with a data path multiplexed with a scan-data path via the third pass-gate. In some embodiments, the apparatus comprises a clock buffer to provide a clock and a complementary version of the clock to the first, second, third, and fourth FF cells. In some embodiments, the first, second, third, and fourth FF cells together form a vectored quad-FF, and wherein an output of the fourth FF cell is coupled to a scan input of another FF cell. In some embodiments, the scan-data paths of the first, second, third, and fourth FF cells are independent of a min-delay buffer.

In another example, an apparatus is provided which comprises: a quad-flip-flop (FF) having four FF cells which are operable to couple sequentially via scan-muxes forming a scan data path, wherein a portion of the scan data path between a first FF cell and a second FF cell from among the four FF cells is formed between a common node of two inverting cells of the first FF cell and a scan-mux associated with the second FF cell. In some embodiments, the first FF cell has a data path multiplexed with a scan-data path of the first FF cell, wherein the first FF cell has a memory element formed of the inverting cells, wherein the two inverting cells are coupled together via the common node. In some embodiments, the second FF cell has a data path multiplexed with a scan-data path of the second FF, and wherein the scan-data path of the second FF cell is coupled to the common node of the first FF cell.

In some embodiments, the apparatus comprises a third FF cell with a data path multiplexed with a scan-data path, wherein the scan-data path of the third FF cell is independent of a min-delay buffer, and wherein the scan-data path of the third FF cell is coupled to the common node of the second FF cell. In some embodiments, the third FF cell includes a memory element formed of at least two inverting cells, and wherein the two inverting cells are coupled together via a common node of the third FF cell. In some embodiments, the apparatus comprises a fourth FF cell with a data path multiplexed with a scan-data path, wherein the scan-data path of the third FF cell is independent of a min-delay buffer, and wherein the scan-data path of the fourth FF cell is coupled to the common node of the third FF cell.

In some embodiments, the apparatus comprises a clock buffer to provide a clock and a complementary version of the clock to the first, second, third, and fourth FF cells. In some embodiments, the first, second, third, and fourth FF cells together form a vectored quad-FF, and wherein an output of the fourth FF cell is coupled to a scan input of another FF cell. In some embodiments, the scan-data paths of the first, second, third, and fourth FF cells are independent of a min-delay buffer.

In some embodiments, the first FF cell includes a master cell having a first memory element, and a slave cell having a second memory element, and wherein the memory element of the first FF is the second memory element. In some embodiments, the second memory element is coupled to the first memory element via a pass-gate. In some embodiments, the apparatus comprises an output driver coupled to the pass-gate and the second memory element.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a first flip-flop (FF) cell with a data path multiplexed with a scan-data path, wherein the first FF cell has a memory element with at least two inverting cells, and
wherein the two inverting cells are coupled together via a common node; and
a second FF cell with a data path multiplexed with a scan-data path, wherein the scan-data path of the second FF cell is coupled to the common node of the first FF cell.

2. The apparatus of claim 1, wherein the second FF cell includes a memory element with at least two inverting cells, and wherein the two inverting cells are coupled together via a common node of the second FF cell.

3. The apparatus of claim 2 comprises a third FF cell with a data path multiplexed with a scan-data path, wherein the scan-data path of the third FF cell is independent of a min-delay buffer, and wherein the scan-data path of the third FF cell is coupled to the common node of the second FF cell.

4. The apparatus of claim 3, wherein the third FF cell includes a memory element with at least two inverting cells, and wherein the two inverting cells are coupled via a common node of the third FF cell.

5. The apparatus of claim 4 comprises a fourth FF cell with a data path multiplexed with a scan-data path, wherein the scan-data path of the third FF cell is independent of a min-delay buffer, and wherein the scan-data path of the fourth FF cell is coupled to the common node of the third FF cell.

6. The apparatus of claim 5 comprises a clock buffer to provide a clock and a complementary version of the clock to the first, second, third, and fourth FF cells.

7. The apparatus of claim 5, wherein the first, second, third, and fourth FF cells together form a vectored quad-FF, and wherein an output of the fourth FF cell is coupled to a scan input of another FF cell.

8. The apparatus of claim 5, wherein the scan-data paths of the first, second, third, and fourth FF cells are independent of a min-delay buffer.

9. The apparatus of claim 1, wherein the first FF cell includes: a master cell having a first memory element; and
a slave cell having a second memory element; and
wherein the memory element of the first FF is the second memory element.

10. The apparatus of claim 9, wherein the second memory element is coupled to the first memory element via a pass-gate.

11. The apparatus of claim 10 comprises an output driver coupled to the pass-gate and the second memory element.

12. An apparatus comprising:
a first flip-flop (FF) cell with a data path multiplexed with a scan-data path,
wherein the first FF cell has a memory element with at least two inverting cells, and wherein the two inverting cells are coupled via a common node;
a first pass-gate coupled to the common node; and
a second FF cell with a data path multiplexed with a scan-data path via the first pass-gate.

13. The apparatus of claim 12, wherein the second FF cell includes a memory element with at least two inverting cells, and wherein the two inverting cells are coupled together via a common node of the second FF cell.

14. The apparatus of claim 13 comprises:
a second pass-gate coupled to the common node of the second FF cell; and
a third FF cell with a data path multiplexed with a scan-data path via the second pass-gate.

15. The apparatus of claim 14 comprises:
a third pass-gate coupled to the common node of the third FF cell; and
a fourth FF cell with a data path multiplexed with a scan-data path via the third pass-gate.

16. The apparatus of claim 15 comprises a clock buffer to provide a clock and a complementary version of the clock to the first, second, third, and fourth FF cells.

17. The apparatus of claim 16, wherein the first, second, third, and fourth FF cells together form a vectored quad-FF, and wherein an output of the fourth FF cell is coupled to a scan input of another FF cell.

18. The apparatus of claim 15, wherein the scan-data paths of the first, second, third, and fourth FF cells are independent of a min-delay buffer.

19. A system comprising:
a memory;
a processor coupled to the memory, the processor including a vectored quad-flip-flop (FF), the quad-FF comprising:

a first flip-flop (FF) cell with a data path multiplexed with a scan-data path, wherein the first FF cell has a memory element with at least two inverting cells, and wherein the two inverting cells are coupled via a common node; and a second FF cell with a data path multiplexed with a scan-data path, and wherein the scan-data path of the second FF cell is coupled to the common node of the first FF cell; and a wireless interface to allow the processor to communicate with another device.

20. The system of claim 19, wherein the vectored quad-FF is coupled to a scan-enabled FF.

21. The system of claim 20, wherein the second FF cell includes a memory element with at least two inverting cells, and wherein the two inverting cells are coupled together via a common node of the second FF cell.

22. The system of claim 21 comprises a third FF cell with a data path multiplexed with a scan-data path, and wherein the scan-data path of the third FF cell is coupled to the common node of the second FF cell.

23. The system of claim 22, wherein the scan-data paths of the first, second, third, and fourth FF cells are independent of a min-delay buffer.

\* \* \* \* \*